United States Patent
He et al.

(10) Patent No.: US 10,571,507 B2
(45) Date of Patent: Feb. 25, 2020

(54) TRANSFORMER WINDING FAULT DIAGNOSIS METHOD BASED ON WIRELESS IDENTIFICATION SENSING

(71) Applicant: WUHAN UNIVERSITY, Hubei (CN)

(72) Inventors: Yigang He, Hubei (CN); Tao Wang, Hubei (CN); Bing Li, Hubei (CN); Hui Zhang, Hubei (CN); Kaipei Liu, Hubei (CN); Liulu He, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 196 days.

(21) Appl. No.: 15/916,164

(22) Filed: Mar. 8, 2018

(65) Prior Publication Data
US 2019/0128946 A1 May 2, 2019

(30) Foreign Application Priority Data
Oct. 27, 2017 (CN) .......................... 2017 1 1027358

(51) Int. Cl.
*G01R 31/02* (2006.01)
*G01P 15/18* (2013.01)

(52) U.S. Cl.
CPC ............ *G01R 31/027* (2013.01); *G01P 15/18* (2013.01)

(58) Field of Classification Search
CPC ..... G01R 31/027; G01P 15/18; G06K 9/6284; G06K 9/00536; G06K 9/0051
USPC .......................................................... 324/546
See application file for complete search history.

(56) References Cited

U.S. PATENT DOCUMENTS

2017/0011612 A1* 1/2017 Jain ...................... G08B 21/182

\* cited by examiner

*Primary Examiner* — Farhana A Hoque
(74) *Attorney, Agent, or Firm* — JCIPRNET

(57) ABSTRACT

A transformer winding fault diagnosis method based on wireless identification sensing includes the following steps: collecting transformer winding vibration signals in a normal state and when a fault occurs; denoising the transformer winding vibration signals by using singular entropy, and randomly dividing the denoised transformer winding vibration signals in the normal state into two groups, where one group is training data, and the other group is original measurement data; using the denoised transformer winding vibration signals obtained when the fault occurs as original threshold data; reconstructing the original threshold data to obtain reconstructed threshold data, and obtaining a transformer winding residual error threshold when the fault occurs; and reconstructing the original measurement data to obtain reconstructed measurement data, obtaining corresponding residual error data, and comparing the residual error data with the residual error threshold, to implement fault diagnosis on the transformer winding. The present invention implements remote, wireless, and unmanned fault diagnosis on a transformer winding. The diagnosis efficiency is high, the workload of a maintenance person is reduced, and the running efficiency of a transformer is increased.

10 Claims, 5 Drawing Sheets

TRANSFORMER WINDING FAULT DIAGNOSIS METHOD BASED ON WIRELESS IDENTIFICATION SENSING

CROSS-REFERENCE TO RELATED APPLICATION

This application claims the priority benefit of China application serial no. 201711027358.3, filed on Oct. 27, 2017. The entirety of the above-mentioned patent application is hereby incorporated by reference herein and made a part of this specification.

BACKGROUND OF THE INVENTION

1. Field of the Invention

The present invention relates to the field of transformer winding fault diagnosis, and in particular, to a transformer winding fault diagnosis method based on wireless identification sensing.

2. Description of Related Art

In a transformer substation, a running status of a transformer directly relates to the safety and reliability of power generation and power supply systems. Existing methods for performing fault diagnosis on a transformer mainly include methods such as an oil chromatography method, a low-voltage pulse method, a short-circuit impedance method, and a frequency response analysis method. However, all of the foregoing four methods are offline diagnosis methods, require a transformer to exit a running state to perform fault diagnosis, and cannot implement fault diagnosis when the transformer is powered on, greatly reducing the power supply reliability. In all existing vibration-based transformer winding fault diagnosis methods, a transformer winding vibration signal is obtained by using a wired speed sensor. This manner increases the wiring costs and post-maintenance costs and has low economic benefits.

SUMMARY OF THE INVENTION

A technical problem to be resolved in the present invention is to provide a transformer winding fault diagnosis method based on wireless identification sensing for disadvantages in existing transformer winding fault diagnosis, so as to effectively implement remote, wireless, and unmanned fault diagnosis on a transformer winding. The diagnosis efficiency is high, the fault diagnosis costs are reduced, the workload of a maintenance person is reduced, and the running efficiency of a transformer is increased.

Technical solutions used in the present invention to resolve the foregoing technical problem are:

A transformer winding fault diagnosis method based on wireless identification sensing includes the following steps:

(1) respectively collecting, by using a vibration sensor integrating a radio frequency identification function, transformer winding vibration signals in a normal state and when a fault occurs, that is, original vibration signals;

(2) denoising the collected transformer winding vibration signals, that is, the original vibration signals by using singular entropy, to obtain denoised transformer winding vibration signals in the normal state and denoised transformer winding vibration signals when the fault occurs; randomly dividing the denoised transformer winding vibration signals in the normal state into two groups, where one group is training data, and the other group is original measurement data; and using the denoised transformer winding vibration signals obtained when the fault occurs as original threshold data;

(3) training a relevant vector machine model by using the training data, reconstructing the original threshold data by using the trained relevant vector machine model to obtain reconstructed threshold data, and obtaining, by using the reconstructed threshold data and the original threshold data, a transformer winding residual error threshold when the fault occurs, where the residual error threshold=the reconstructed threshold data—the original threshold data; and (4) reconstructing the original measurement data by using the trained relevant vector machine model to obtain reconstructed measurement data, obtaining corresponding residual error data by using the reconstructed measurement data and the original measurement data, where the residual error data=the reconstructed measurement data—the original measurement data, and comparing the residual error data with the residual error threshold obtained in the step (3), to implement fault diagnosis on a transformer winding.

Further, in the step (1), the vibration sensor integrating the radio frequency identification function includes a magnetic field energy obtaining apparatus disposed on an outer periphery of a transformer, and the magnetic field energy obtaining apparatus is configured to obtain energy from a magnetic field surrounding the transformer to supply power for the vibration sensor integrating the radio frequency identification function, implementing energy self-acquiring by the vibration sensor integrating the radio frequency identification function (so that the vibration sensor integrating the radio frequency identification function conveniently collects and stores the transformer winding vibration signals).

Further, the magnetic field energy obtaining apparatus includes a magnetic field energy acquirer and a rectifier, the magnetic field energy acquirer is electrically connected to the rectifier, the magnetic field energy acquirer is configured to convert magnetic field energy into electric energy, and the rectifier is configured to convert an alternating current collected by the magnetic field energy acquirer into a direct current, and increase an output voltage.

Further, the magnetic field energy acquirer is a solenoid including an iron core, the iron core is made of cast iron, and the ratio of the diameter of the iron core to the length of the iron core is in a range of [0.05, 0.07].

Further, the rectifier includes a voltage doubler rectifier circuit and a boost converter.

Further, the vibration sensor integrating the radio frequency identification function further includes a voltage modulator, an MCU, a three-axis acceleration sensor, and a radio frequency identification sensing chip, an input of a rectifier is an output of a magnetic field energy acquirer, an output end of the rectifier is connected to an input end of the low dropout modulator, an output end of the voltage modulator is electrically connected to the MCU, both the three-axis acceleration sensor and the radio frequency identification sensing chip are electrically connected to the MCU by using an I$^2$C bus, and the radio frequency identification sensing chip is externally connected to an antenna; the three-axis acceleration sensor is configured to collect a transformer winding vibration signal; the low dropout modulator is configured to regulate an output voltage of the rectifier, to obtain a stable DC voltage output; the MCU is configured to set a signal sampling frequency and a sampling time of the vibration sensor integrating the radio frequency identification function and manage processing and transmission of the collected transformer winding vibration signal inside the vibration sensor integrating the radio frequency identification function; and the radio frequency identification sensing chip is configured to implement communication and data transmission between the vibration sensor integrating the radio frequency identification function and an external device.

Further, in the step (2), a specific method for the denoising the collected transformer winding vibration signals, that is, the original vibration signals by using singular entropy is:

mapping original vibration signal data to a high dimensional matrix, calculating a singular spectrum of the high dimensional matrix, and determining an order of a matrix of the denoised transformer winding vibration signals according to the singular spectrum, to extract denoised data that can reflect characteristics of the original vibration signals, where if the original vibration signals are transformer winding vibration signals in the normal state, the extracted denoised data is transformer winding vibration signals in the normal state; or if the original vibration signals are transformer winding vibration signals obtained when the fault occurs, the extracted denoised data is transformer winding vibration signals obtained when the fault occurs (that is, the original threshold data).

Further, in the step (3), the transformer winding residual error threshold obtained when the fault occurs is in a range of [0.03, 0.1].

Further, in the step (4), the implementing fault diagnosis on a transformer winding is specifically: when the residual error data RE>0.03, determining that a fault occurs on the transformer winding.

The working principle of the present invention is: A transformer winding signal is wirelessly collected and transmitted by using a vibration sensor integrating a radio frequency identification function. In addition to a winding vibration signal, a vibration signal collected from an outer wall of an oil tank of a transformer further includes a large number of harmonic components and an interference signal generated by another vibration source. Additionally, the collected vibration signal inevitably suffers electromagnetic interference when being wirelessly transmitted by the vibration sensor integrating the radio frequency identification function, and collected original data, that is, the vibration signal, includes noise of different types and different intensity. Consequently, accurate fault diagnosis cannot be performed. Therefore, a collected original vibration signal is denoised by using singular entropy. The denoising by using the singular entropy is an effective denoising method for an unstable non-linear signal. In this method, an original signal is mapped to a high dimensional matrix, a singular spectrum of the matrix is calculated, and an order of a matrix of a denoised transformer winding vibration signal that can represent a characteristic of the original vibration signal is determined according to the singular spectrum, to extract denoised data; and finally, the denoised data after denoising is reconstructed by using a least squares support vector machine regression model, the reconstructed data is compared with measurement data to obtain a residual error, and the residual error is compared with a residual error threshold obtained when a fault occurs, so as to implement transformer winding fault diagnosis.

Compared with the prior art, the present invention has the following beneficial effects:

1. A transformer winding signal is wirelessly collected and transmitted by using a vibration sensor integrating a radio frequency identification function, implementing remote, wireless, and unmanned fault diagnosis on a transformer winding. The present invention is easy in implementation and increases the running efficiency of a transformer.

2. The vibration sensor integrating the radio frequency identification function includes a magnetic field energy obtaining apparatus disposed on an outer periphery of the transformer, energy of a magnetic field surrounding the transformer is captured, and is used as an energy source of the vibration sensor integrating the radio frequency identification function; the shape of the magnetic field energy obtaining apparatus is customized for high efficiency; in addition, vibration signal data is collected by using a three-axis acceleration sensor disposed on the vibration sensor integrating the radio frequency identification function, and a memory management model of a radio frequency identification sensing chip is optimized by means of embedding the data into the ID of the radio frequency identification sensing chip, so that the vibration sensor integrating the radio frequency identification function has a data storage function with low power consumption.

3. A collected original vibration signal is denoised by using singular entropy, increasing the speed and precision of subsequent fault diagnosis.

4. Data after the denoising is reconstructed by using a relevant vector machine model to implement transformer winding fault diagnosis, reducing the fault diagnosis costs and the workload of a maintenance person and increasing the diagnosis speed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
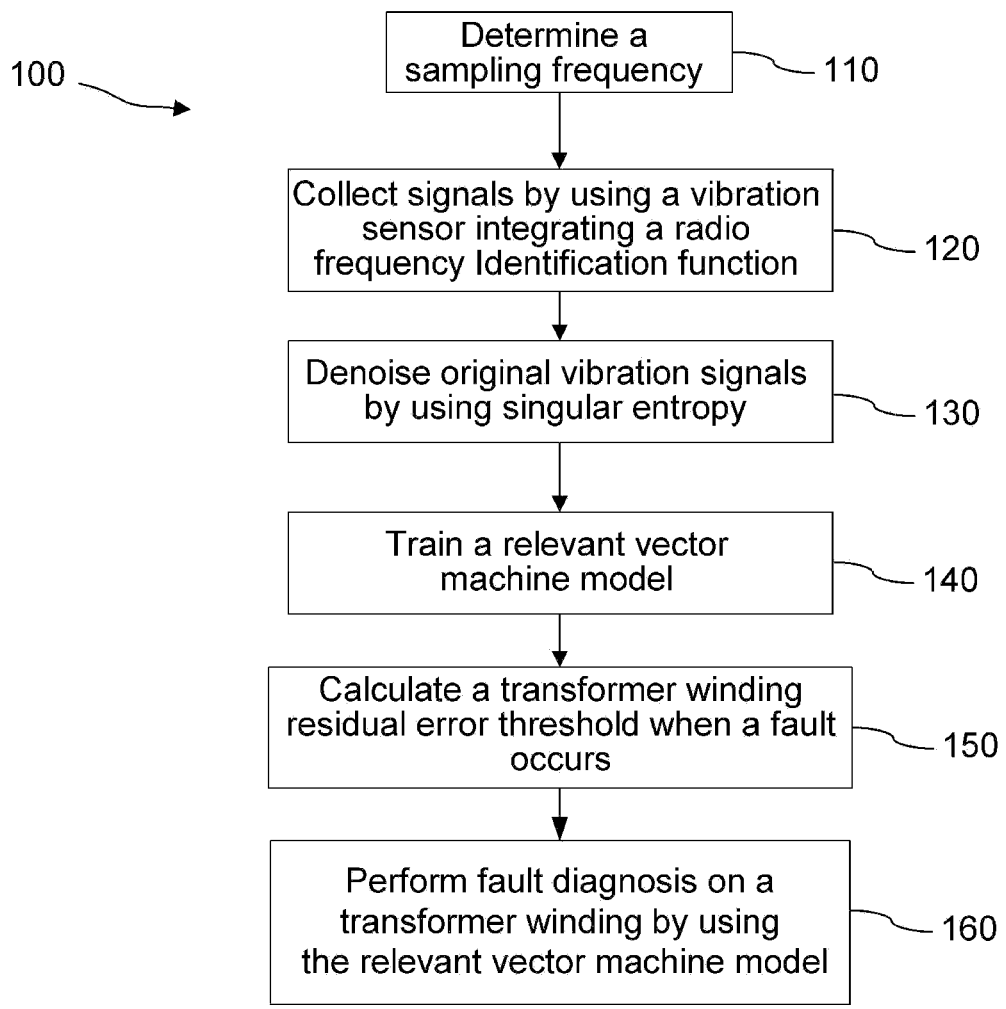
FIG. 1 is a flowchart of a transformer winding fault diagnosis method based on wireless identification sensing according to the present invention.

Reference will now be made in detail to the present preferred embodiments of the invention, examples of which are illustrated in the accompanying drawings. Wherever possible, the same reference numbers are used in the drawings and the description to refer to the same or like parts.

The following describes technical solutions of the present invention with reference to the accompanying drawings and relatively preferable embodiments in detail. The following relatively preferable embodiments are only used for describing and explaining the present invention, but do not constitute a limitation on the technical solutions of the present invention.

Referring to FIG. 1, FIG. 1 is a flowchart 100 of a transformer winding fault diagnosis method based on wireless identification sensing according to the present invention. The method includes the following steps:

(1) In step 110, determine a sampling frequency, and step 120, respectively collect, by using a vibration sensor integrating a radio frequency identification function, transformer winding vibration signals in a normal state and when a fault occurs, that is, original vibration signals.

(2) In step 130, denoise the collected original vibration signals, to obtain denoised transformer winding vibration signals in the normal state and denoised transformer winding vibration signals when the fault occurs; randomly divide the denoised transformer winding vibration signals in the normal state into two groups, where one group is training data, and the other group is original measurement data; and use the denoised transformer winding vibration signals obtained when the fault occurs as original threshold data.

(3) In step 140, train a relevant vector machine model by using the training data; reconstruct the original threshold data by using the trained relevant vector machine model (the reconstruction of the original threshold data is an existing technology, which can refer to "Transformer Fault Diagnosis based on Multiple Time Series Reconstruction and LS-SVR [J] by Qu FengCheng, Zhang XiuPing, Qiu Min, and so on in Electrical Measurement & Instrumentation, 2014, 51(15): 64-67.") to obtain reconstructed threshold data; and obtain, in step 150, by using the reconstructed threshold data and the original threshold data, a transformer winding residual error threshold when the fault occurs, where the residual error threshold=the reconstructed threshold data—the original threshold data, and in the embodiments, the transformer winding residual error threshold obtained when the fault occurs is in a range of [0.03, 0.1].

(4) In step 160, reconstruct the original measurement data by using the trained relevant vector machine model to obtain reconstructed measurement data, obtain corresponding residual error data by using the reconstructed measurement data and the original measurement data, where the residual error data=the reconstructed measurement data—the original measurement data, and compare the residual error data with the residual error threshold obtained in the step (3), to implement fault diagnosis on a transformer winding. The implementing fault diagnosis on a transformer winding is specifically: when the residual error data RE>0.03, determining that a fault occurs on the transformer winding.

Figure 2:
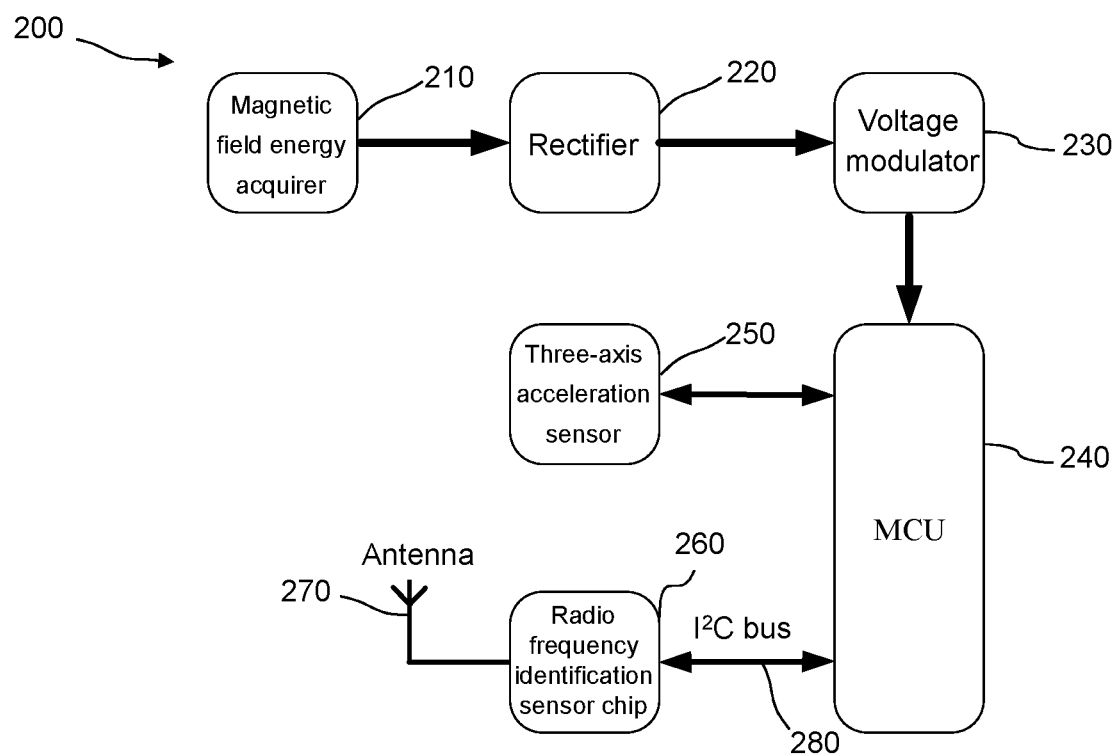
FIG. 2 is an overall structural diagram of a vibration sensor integrating a radio frequency identification function according to the present invention.

As shown in FIG. 2, a vibration sensor integrating a radio frequency identification function 200 includes a magnetic field energy acquirer 210, a rectifier 220, a voltage modulator 230, a micro control unit 240 (MCU), a three-axis acceleration sensor 250, a radio frequency identification sensing chip 260, an I²C bus 280, and an antenna 270. The magnetic field energy acquirer 210 is electrically connected to the rectifier, an input of the rectifier 220 is an output of the magnetic field energy acquirer 210, an output end of the rectifier 220 is connected to an input end of the voltage modulator 230, an output end of the voltage modulator 230 is electrically connected to the MCU 240, both the three-axis acceleration sensor 250 and the radio frequency identification sensing chip 260 are electrically connected to the MCU 240 by using an I²C bus 280, and the radio frequency identification sensing chip 260 is externally connected to an antenna 270.

The magnetic field energy acquirer 210 and the rectifier 220 are disposed on an outer periphery of a transformer, to jointly form a magnetic field energy obtaining apparatus, the magnetic field energy acquirer 210 is configured to convert magnetic field energy into electric energy, and the rectifier 220 is configured to convert an alternating current collected by the magnetic field energy acquirer 210 into a direct current, and increase an output voltage.

The three-axis acceleration sensor 250 is configured to collect a transformer winding vibration signal, that is, an original vibration signal.

The voltage modulator 230 is configured to regulate an output voltage of the rectifier, to obtain a stable DC voltage output.

The MCU 240 is configured to set a signal sampling frequency and a sampling time of the vibration sensor integrating the radio frequency identification function and manage processing and transmission of the collected transformer winding vibration signal inside the vibration sensor integrating the radio frequency identification function.

The radio frequency identification sensing chip 260 is configured to implement communication and data transmission between the vibration sensor and an external device (not shown), where the external device may be a computer, and the steps (2), (3), and (4) are performed inside the computer.

The I²C bus 280 is configured to implement communication between the MCU 240 and the remaining part of the radio frequency identification sensing chip 260 and data transmission between the three-axis acceleration sensor 250 and the MCU 240; and the antenna 270 is configured to send and receive a radio frequency signal.

Figure 3:
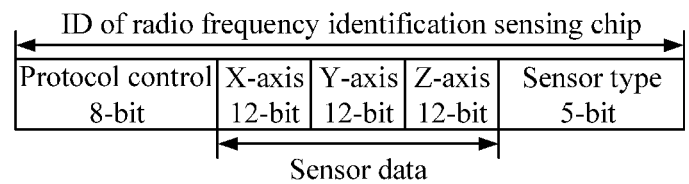
FIG. 3 is a schematic diagram of a memory management model of a radio frequency identification sensing chip according to the present invention.
Figure 4:
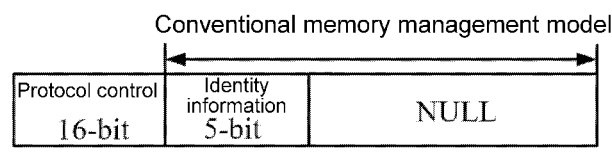
FIG. 4 is a schematic diagram of a conventional memory management model according to the present invention.

FIG. 3 shows a memory management model of a radio frequency identification sensing chip of a vibration sensor integrating a radio frequency identification function according to the present invention. Compared with a conventional memory management model shown in FIG. 4, the radio frequency identification sensing chip of the vibration sensor integrating the radio frequency identification function of the present invention uses its free space to store original vibration signal data. In addition, the protocol control is simplified for higher transmission efficiency.

Figure 5:
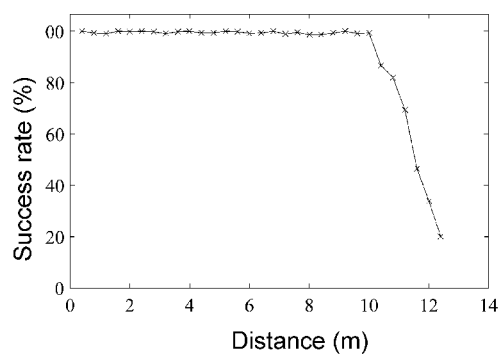
FIG. 5 is a diagram of a relationship between a working distance of a radio frequency identification sensing chip of a vibration sensor integrating a radio frequency identification function and a communication success rate according to the present invention.

FIG. 5 is a diagram of a relationship between a working distance of a radio frequency identification sensing chip of a vibration sensor integrating a radio frequency identification function and a communication success rate according to the present invention. A distance within which a communication success rate is greater than or equal to 80% may be considered as an effective communication distance. It can be learned from the figure that, the longest effective communication distance of the vibration sensor is 10.5 m, within which remote fault diagnosis on a transformer winding can be implemented.

Figure 6:
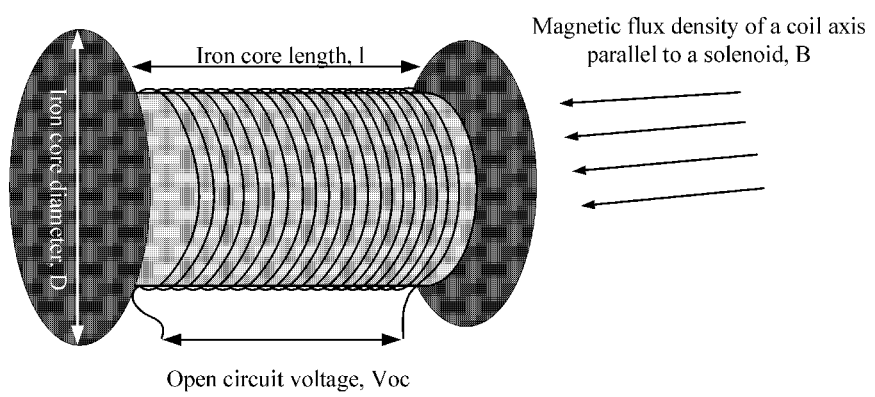
FIG. 6 is a structural diagram of a magnetic field energy acquirer according to the present invention.

FIG. 6 is a structural diagram of a magnetic field energy acquirer 600 of a vibration sensor integrating a radio frequency identification function according to the present invention. The magnetic field energy acquirer 600 is a solenoid 610 including an iron core 620, the iron core 620 is made of cast iron. The two ends of the iron core are modified for higher energy capture efficiency. The working principle of the magnetic field energy acquirer 600 is as follows:

It can be learned from the Faraday's law of induction that, an open circuit voltage $V_{oc}$ of the magnetic field energy acquirer is $$V_{OC} = 2\pi f \mu_{eff} N\pi(0.5D)^2 B,$$

where, in the formula, B is the magnetic flux density of a coil axis parallel to the solenoid, f is a frequency corresponding to a magnetic field, $\mu_{eff}$ is effective magnetic permeability, N is a number of turns per coil, and D is an iron core diameter; the ratio of the iron core diameter D to an iron core length l is in a range of [0.05, 0.07]. In the embodiments, 0.066 is preferable, and this value is selected while considering the energy obtaining efficiency and costs.

Figures 7A, 7B:
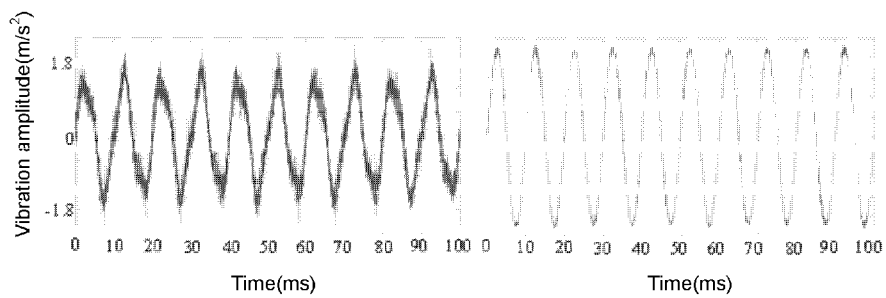
FIGS. 7(*a*) and 7(*b*) are diagrams of comparison between measurement data (that is, an original vibration signal) before denoising by using singular entropy and data after the denoising.

FIGS. 7a and 7b show comparison between measurement data (that is, an original vibration signal) before denoising by using singular entropy (FIG. 7a) and data after the denoising (FIG. 7b). It can be learned from FIG. 7b that, the data after the denoising is close to the original vibration signal, but a noise component may be ignored. A specific method for denoising, a collected transformer winding vibration signal, that is, the original vibration signal by using singular entropy is:

specifying original vibration signal data $X=[x_i]$ (i=1, 2, ..., P), where $x_i$ indicates an element of the original vibration signal data, i is an element number, P is a data length, and mapping the original vibration signal data to a high dimensional matrix $W \in R^{m \times n}$, to obtain $$W = \begin{bmatrix} x_1 & x_2 & \cdots & x_n \\ \vdots & \vdots & \ddots & \vdots \\ x_{(i-1)\tau+1} & x_{(i-1)\tau+2} & \cdots & x_{(i-1)\tau+n} \\ \vdots & \vdots & \ddots & \vdots \\ x_{(m-1)\tau+1} & x_{(m-1)\tau+2} & \cdots & x_{(m-1)\tau+n} \end{bmatrix}, n = P - (m-1)\tau,$$

where, in the formula, n is the width of a sliding window, m is the dimension of the high dimensional matrix, and r is a delay time; and m may be obtained by using a mutual information method, and r may be obtained by using a Cao algorithm. Singular value decomposition may be performed on the high dimensional matrix W, to obtain $W=U\cdot\Lambda\cdot V^T$, where U and V are singular vectors of the matrix W, and $\Lambda$ is a diagonal matrix as follows:

$$\Lambda = \begin{bmatrix} \lambda_1 & & \\ & \ddots & \\ & & \lambda_q \end{bmatrix},$$

where, in the formula, $\lambda_1 \geq \lambda_2 \geq \ldots \geq \lambda_q$, $\lambda_j$ (j=1, 2, ..., q) is a singular value of W, j is a singular value number, and q is a number of singular values; therefore, singular entropy of an order k may be calculated by using the following formula:

$$E_k = \sum_{j=1}^{k} \Delta E_j, \quad (j \leq q),$$

where, $\Delta E_j$ indicates an increment of singular entropy of an order j, and may be calculated by using the following formula:

$$\Delta E_j = -\left(\lambda_j \bigg/ \sum_{k=1}^{q} \lambda_k\right) \cdot \ln\left(\lambda_j \bigg/ \sum_{k=1}^{q} \lambda_k\right).$$

Increments of singular entropy of different orders jointly form a singular spectrum, where a horizontal coordinate of the singular spectrum is an order, and a longitudinal coordinate is an increment of singular entropy of the corresponding order.

In the singular spectrum of the high dimensional matrix W calculated by using the foregoing formulas, an order c of singular entropy, when an increment of the singular entropy tends to be steady (when a gradient is within [−0.5, 0.5]), is selected as an order of a matrix of a denoised vibration signal; first c main diagonal elements of the diagonal matrix $\Lambda$ are retained; the other main diagonal elements are set to zero, to obtain a new diagonal matrix $\Lambda'$; $\Lambda'$ may be restructured ($W'=U\cdot\Lambda'\cdot V^T$) to obtain denoised data W' after the denoising; and a characteristic of the original vibration signal is reflected by using the denoised data after the denoising.

If the original vibration signals are transformer winding vibration signals in the normal state, the extracted denoised data is transformer winding vibration signals in the normal state; or if the original vibration signals are transformer winding vibration signals obtained when the fault occurs, the extracted denoised data is transformer winding vibration signals obtained when the fault occurs (that is, the original threshold data).

Figure 8:
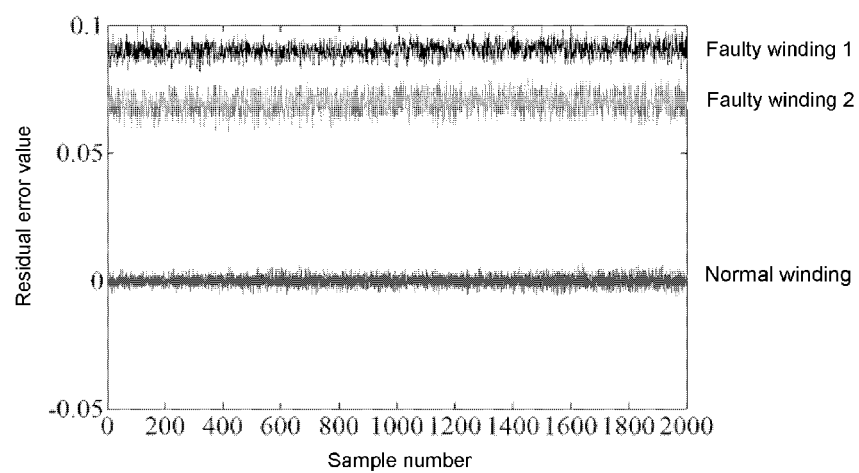
FIG. 8 shows a result of performing fault diagnosis on a transformer winding by using a relevant vector machine model.

FIG. 8 shows a result of performing fault diagnosis on a transformer winding by using a relevant vector machine model. It can be learned from FIG. 8 that, for a fault and a winding in a normal state, residual errors obtained by using this model are obviously different, and fault diagnosis can be effectively implemented. A method for obtaining the relevant vector machine model is as follows:

specifying a training data set $\{x_i, t_i\}_{i=1}^{N}$, $x_i$ is the input vector and $t_i$ is the corresponding target. Assume a training data set $\{x_i, t_i\}_{i=1}^{N}$, $x_i$ is the input vector and $t_i$ is the corresponding target. Then the target $t_i$ is defined as follows:

$$t_i = y(x_i; w) + \delta_i, \delta_i \square N(0, \sigma^2)$$

where $w=(w_0, w_1, \ldots, w_N)^T$ is weight vector and $\delta_i$ is noise.

Assume that $t_i$ is independent and the likelihood of the whole data set is defined as follows:

$$p(t|w, \sigma^2) = (2\pi\sigma^2)^{-N/2} \exp\left\{-\frac{1}{2\sigma^2}\|t - \mu w\|^2\right\}$$

where $t=(t_1, t_2, \ldots, t_N)^T$, $\mu=(\mu(x_1), \mu(x_2), \ldots, \mu(x_N))$, and $\mu(x_i)[1, K(x_i, x_1), K(x_i, x_2), \ldots, K(x_i, x_N)]^T$, $K(x_i, x)$ represents kernel function. The maximum likelihood estimations of w and $\sigma^2$ may result in over-fitting phenomenon, thus, the zero-mean Gaussian prior probability distribution is employed to constrain these two parameters:

$$p(w|\lambda) = \prod_{i=0}^{N} N(w_i | 0, \lambda_i^{-1})$$

where $\lambda$ is a (N+1) dimensional hyper-parameters vector.

The posterior probability of all the unknown parameters can be obtained based on Bayes' rule:

$$p(w, \lambda, \sigma^2 \mid t) = \frac{p(t \mid w, \lambda, \sigma^2) p(w, \lambda, \sigma^2)}{\int p(t \mid w, \lambda, \sigma^2) p(w, \lambda, \sigma^2) dw\, d\lambda\, d\sigma^2}$$

The $p(w, \lambda, \sigma^2 \mid t)$ is decomposed into:

$$p(w,\lambda,\sigma^2 \mid t) = p(w \mid t,\lambda,\sigma^2) p(\lambda,\sigma^2 \mid t)$$

The posterior distribution of weights can be obtained based on Bayes' rule:

$$p(w \mid t, \lambda, \sigma^2) =$$

$$\frac{p(t \mid w, \sigma^2) p(w \mid \lambda)}{p(t \mid \lambda, \sigma^2)} = (2\pi)^{-(N+1)/2} \left|\sum\right|^{-1/2} \exp\left\{-0.5(w-\varphi)^T {\sum}^{-1} (w-\varphi)\right\}$$

where $\varphi = \sigma^{-2}\Sigma\mu^T t$, $\Sigma = (\sigma^{-2}\mu^T\mu + A)^{-1}$ and $A = (\lambda_0, \lambda_1, \ldots, \lambda_N)$.

$p(t \mid \lambda, \sigma^2)$ can be defined as follows due to the uniformed hyper-parameters:

$$p(t \mid \lambda, \sigma^2) = \int p(t \mid w, \sigma^2) p(w \mid \lambda) dw =$$

$$(2\pi)^{-N/2} |\sigma^2 I + \mu A^{-1}\mu^T|^{-\frac{1}{2}} \cdot \exp\{-0.5 t^T (\sigma^2 I + \mu A^{-1}\mu^T)^{-1} t\}$$

The maximum posterior estimation (MPE) of weights can be defined by posterior mean that are determined by $\lambda$ and $\sigma^2$. In [36] a iterative equation is proposed to obtain the $\lambda_{MPE}$ and $\sigma_{MPE}^2$:

$$\lambda_i^{new} = \frac{1 - \lambda_i \Sigma_{ii}}{\varphi_i^2}, \quad (\sigma^2)^{new} = \frac{\|t - \mu\varphi\|^2}{N - \sum_i (1 - \lambda_i \Sigma_{ii})},$$

where $\Sigma_{ii}$ is the i-th diagonal element of matrix $\Sigma$.

For a new input vector of $x_*$, the predictive distribution of output can be obtained by following formula:

$$p(t_* \mid t, \lambda_{MPE}, \sigma_{MPE}^2) = \int p(t_* \mid w, \sigma_{MPE}^2) p(w \mid t, \lambda_{MPE}, \sigma_{MPE}^2) dw$$

Since all the terms in the integrand are Gaussian, the result is also Gaussian:

$$p(t_* \mid t, \lambda_{MPE}, \sigma_{MPE}^2) = (t_* \mid y_*, \sigma_*^2),$$

$$y_* = \sigma^T \mu(x_*),$$

$$\sigma_*^2 = \sigma_{MPE}^2 + \mu(x_*)^T \Sigma \mu(x_*).($$

The kernel function $K(x_i, x)$ is employed to projects the input vector to a high-dimensional space, and it is important to the prediction accuracy of RVM. Gaussian kernel function and polynomial kernel function are employed as the kernel of relevant vector machine model, and the functions are described as follows:

$$K_G(x, x_i) = \exp\left(-\frac{\|x_i - x\|^2}{2\theta^2}\right)$$

where $\theta$ is the kernel width.

$$K_p(x, x_i) = [x_i^T x + 1]^2$$

In the foregoing content, exemplary descriptions about the present invention are provided with reference to the accompanying drawings, and there is a plurality of changes and variations in structure and layout. Therefore, equivalent technical solutions also belong to the scope of the present invention, and all insubstantial improvements obtained by using the concept and solutions of the present invention fall within the protection scope of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transformer winding fault diagnosis method based on wireless identification sensing, comprising the following steps:
    (1) respectively collecting, by using a vibration sensor integrating a radio frequency identification function, transformer winding vibration signals in a normal state and when a fault occurs, that is, original vibration signals;
    (2) denoising the collected transformer winding vibration signals, that is, the original vibration signals by using singular entropy, to obtain denoised transformer winding vibration signals in the normal state and denoised transformer winding vibration signals when the fault occurs; randomly dividing the denoised transformer winding vibration signals in the normal state into two groups, wherein one group is training data, and the other group is original measurement data; and using the denoised transformer winding vibration signals obtained when the fault occurs as original threshold data;
    (3) training a relevant vector machine model by using the training data, reconstructing the original threshold data by using the trained relevant vector machine model to obtain reconstructed threshold data, and obtaining, by using the reconstructed threshold data and the original threshold data, a transformer winding residual error threshold when the fault occurs, wherein the residual error threshold=the reconstructed threshold data—the original threshold data; and
    (4) reconstructing the original measurement data by using the trained relevant vector machine model to obtain reconstructed measurement data, obtaining corresponding residual error data by using the reconstructed measurement data and the original measurement data, wherein the residual error data=the reconstructed measurement data—the original measurement data, and comparing the residual error data with the residual error threshold obtained in the step (3), to implement fault diagnosis on a transformer winding.

2. The transformer winding fault diagnosis method based on wireless identification sensing according to claim 1, wherein in the step (1), the vibration sensor integrating the radio frequency identification function comprises a magnetic field energy obtaining apparatus disposed on an outer periphery of a transformer, and the magnetic field energy obtaining apparatus is configured to obtain energy from a magnetic field surrounding the transformer to supply power for the vibration sensor integrating the radio frequency identification function, implementing energy self-acquiring by the vibration sensor integrating the radio frequency identification function.

3. The transformer winding fault diagnosis method based on wireless identification sensing according to claim 1, wherein the magnetic field energy obtaining apparatus comprises a magnetic field energy acquirer and a rectifier, the magnetic field energy acquirer is electrically connected to the rectifier, the magnetic field energy acquirer is configured to convert magnetic field energy into electric energy, and the rectifier is configured to convert an alternating current collected by the magnetic field energy acquirer into a direct current, and increase an output voltage.

4. The transformer winding fault diagnosis method based on wireless identification sensing according to claim 3, wherein the magnetic field energy acquirer is a solenoid comprising an iron core, the iron core is made of cast iron, and the ratio of the diameter of the iron core to the length of the iron core is in a range of [0.05, 0.07].

5. The transformer winding fault diagnosis method based on wireless identification sensing according to claim 3, wherein the rectifier comprises a voltage doubler rectifier circuit and a boost converter.

6. The transformer winding fault diagnosis method based on wireless identification sensing according to claim 2, wherein the vibration sensor integrating the radio frequency identification function further comprises a voltage modulator, a micro control unit (MCU), a three-axis acceleration sensor, and a radio frequency identification sensing chip, an input of a rectifier is an output of a magnetic field energy acquirer, an output end of the rectifier is connected to an input end of the voltage modulator, an output end of the voltage modulator is electrically connected to the MCU, both the three-axis acceleration sensor and the radio frequency identification sensing chip are electrically connected to the MCU by using an I²C bus, and the radio frequency identification sensing chip is externally connected to an antenna; the three-axis acceleration sensor is configured to collect a transformer winding vibration signal; the voltage modulator is configured to regulate an output voltage of the rectifier, to obtain a stable DC voltage output; the MCU is configured to set a signal sampling frequency and a sampling time of the vibration sensor integrating the radio frequency identification function and manage processing and transmission of the collected transformer winding vibration signal inside the vibration sensor integrating the radio frequency identification function; and the radio frequency identification sensing chip is configured to implement communication and data transmission between the vibration sensor integrating the radio frequency identification function and an external device.

7. The transformer winding fault diagnosis method based on wireless identification sensing according to claim 1, wherein in the step (2), a specific method for the denoising the collected transformer winding vibration signals, that is, the original vibration signals by using singular entropy is:
mapping original vibration signal data to a high dimensional matrix, calculating a singular spectrum of the high dimensional matrix, and determining an order of a matrix of the denoised transformer winding vibration signals according to the singular spectrum, to extract denoised data that reflects characteristics of the original vibration signals, wherein
if the original vibration signals are transformer winding vibration signals in the normal state, the extracted denoised data is transformer winding vibration signals in the normal state; or if the original vibration signals are transformer winding vibration signals obtained when the fault occurs, the extracted denoised data is transformer winding vibration signals obtained when the fault occurs.

8. The transformer winding fault diagnosis method based on wireless identification sensing according to claim 1, wherein in the step (3), the transformer winding residual error threshold obtained when the fault occurs is in a range of [0.03, 0.1].

9. The transformer winding fault diagnosis method based on wireless identification sensing according to claim 8, wherein in the step (4), the implementing fault diagnosis on a transformer winding is specifically: when the residual error data RE>0.03, determining that a fault occurs on the transformer winding.

10. The transformer winding fault diagnosis method based on wireless identification sensing according to claim 2, wherein the magnetic field energy obtaining apparatus comprises a magnetic field energy acquirer and a rectifier, the magnetic field energy acquirer is electrically connected to the rectifier, the magnetic field energy acquirer is configured to convert magnetic field energy into electric energy, and the rectifier is configured to convert an alternating current collected by the magnetic field energy acquirer into a direct current, and increase an output voltage.

* * * * *